(12) United States Patent
Houston (10) Patent No.: US 7,199,471 B2
(45) Date of Patent: Apr. 3, 2007

(54) METHOD AND APPARATUS FOR REDUCING CAPACITIVE COUPLING BETWEEN LINES IN AN INTEGRATED CIRCUIT

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1256 days.

(21) Appl. No.: 10/001,707

(22) Filed: Oct. 25, 2001

(65) Prior Publication Data

US 2002/0079587 A1 Jun. 27, 2002

Related U.S. Application Data

(60) Provisional application No. 60/257,726, filed on Dec. 21, 2000.

(51) Int. Cl.
*H01L 23/48* (2006.01)
*H01L 21/4763* (2006.01)

(52) U.S. Cl. ............ 257/758; 257/773; 438/622

(58) Field of Classification Search ........ 257/758, 257/773, 776, 296; 365/63; 438/622
See application file for complete search history.

(56) References Cited

U.S. PATENT DOCUMENTS 5,841,688 A * 11/1998 Sukegawa et al. ............ 356/63

OTHER PUBLICATIONS

Takeda, et al. "A 16-mb 400-MHz Loadless CMOS Four-Transistor SRAM Macro", IEEE Journal of Solid-State Circuits, vol. 35, No. 11, Nov. 2000, pp. 1631-1640.

* cited by examiner

*Primary Examiner*—Mark V. Prenty
(74) *Attorney, Agent, or Firm*—Peter K. McLarty; W. James Brady, III; Frederick J. Telecky, Jr.

(57) ABSTRACT

An integrated circuit (78) includes a memory circuit (10, 110, 210, 310, 410) having a group of bitlines (21–28, 121–128, 221–228, 321–328, 421–428), and having an array of memory cells (11–18) which are each electrically coupled to two bitlines of the group. Each bitline has alternating first (61, 63, 65) and second (62, 64, 66) portions that are respectively located in metalization layers disposed on opposite sides of an insulating layer (84). The first and second portions are electrically coupled by vias (51–54, 334, 437) which extend through the insulating layer. Along the length of each bitline, each first and second portion thereof is disposed in a metalization layer opposite from the metalization layer containing the adjacent portion of each adjacent bitline.

22 Claims, 6 Drawing Sheets

METHOD AND APPARATUS FOR REDUCING CAPACITIVE COUPLING BETWEEN LINES IN AN INTEGRATED CIRCUIT

This application claims priority under 35 U.S.C. § 119(e)(1) of provisional application No. 60/257,726 filed Dec. 21, 2000.

TECHNICAL FIELD OF THE INVENTION

This invention relates in general to integrated circuits and, more particularly, to a method and apparatus for reducing capacitive coupling between lines in an integrated circuit.

BACKGROUND OF THE INVENTION

One common type of integrated circuit is a memory circuit having a plurality of memory cells arranged in a two-dimensional array. In order to facilitate access to the memory cells, a plurality of conductive runs known as bitlines extend in a direction from one end of the array to the other end, with each memory cell being electrically coupled to two of the bitlines. When information is read from or written into one of the memory cells, the two bitlines coupled to that cell carry a differential voltage. Most such memory circuits read and write information to or from several memory cells at the same time, for example where each such cell corresponds to a respective bit of a binary word. Thus, at a given point in time, each of the bitlines in the memory circuit may be carrying one side of a respective differential signal associated with a respective memory cell.

For a number of years, there have been ongoing efforts to decrease the physical size of these memory circuits within an integrated circuit. As a result, the physical size of these memory circuits has progressively decreased over time, such that a given amount of memory storage has been implemented in progressively smaller and smaller amounts of the area of a semiconductor wafer. Consequently, over time, the bitlines associated with a memory cell array have necessarily moved closer and closer to each other, which in turn has tended to increase the capacitive coupling between the bitlines.

Capacitive coupling is most acute in a form of these memory circuits where each column of memory cells is served by a single pair of bitlines which, throughout their length, extend parallel to each other and also parallel to bitlines in adjacent columns. In order to reduce capacitive coupling between a bitline in one column with respect to a bitline in an adjacent column, a known technique is to provide the two bitlines in each column with several twists or crossovers at spaced locations along their lengths, with the crossovers in each pair of adjacent columns being staggered or offset. Another known technique is different, in that it does not use a single pair of bitlines to serve an entire column of memory cells. Instead, each bitline is routed in a stairstep manner across other bitlines until an outer side of the memory circuit is reached, and then is routed back across the other bitlines in a stairstep manner.

In all of these known techniques, virtually all the material of the bitlines is in a single metalization layer. In the approaches where a bitline crosses another bitline, one of the bitlines will have, in a second metalization layer, a very short portion which is just long enough to effect the crossover. While these known techniques have been generally adequate for their intended purposes, they have not been satisfactory in all respects.

More specifically, as advances in fabrication techniques have permitted the size of these types of memory circuits to be progressively reduced, the bitlines have moved progressively closer to each other, such that capacitive coupling remains a progressively increasing problem, even where two given bitlines are adjacent each other over a relatively short portion of their length. New techniques are needed to deal with the progressively increasing levels of capacitive coupling that result from advances in fabrication technology.

SUMMARY OF THE INVENTION

From the foregoing, it may be appreciated that a need has arisen for a method and apparatus for implementing two or more runs in an integrated circuit in manner which is effective in reducing capacitive coupling between those runs. According to the present invention, a method and apparatus are provided to address this need, and relate to an integrated circuit having an insulating layer and a group of at least two elongate runs which are electrically conductive, which are electrically separate from each other, and which each extend approximately in a given direction. The method and apparatus involve: configuring each of the runs to have along the length thereof alternating first and second portions that are electrically coupled by third portions; locating the first portions of each of the runs on a side of the insulating layer opposite from the second portions thereof in a manner so that, for substantially each point along each of the first and second portions of each of the runs, a plane perpendicular to the direction and containing that point intersects a respective different point of every other run, each pair of adjacent points in the plane being points which are respectively located on opposite sides of the insulating layer; and fabricating at least part of the third portions to extend through the insulating layer.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
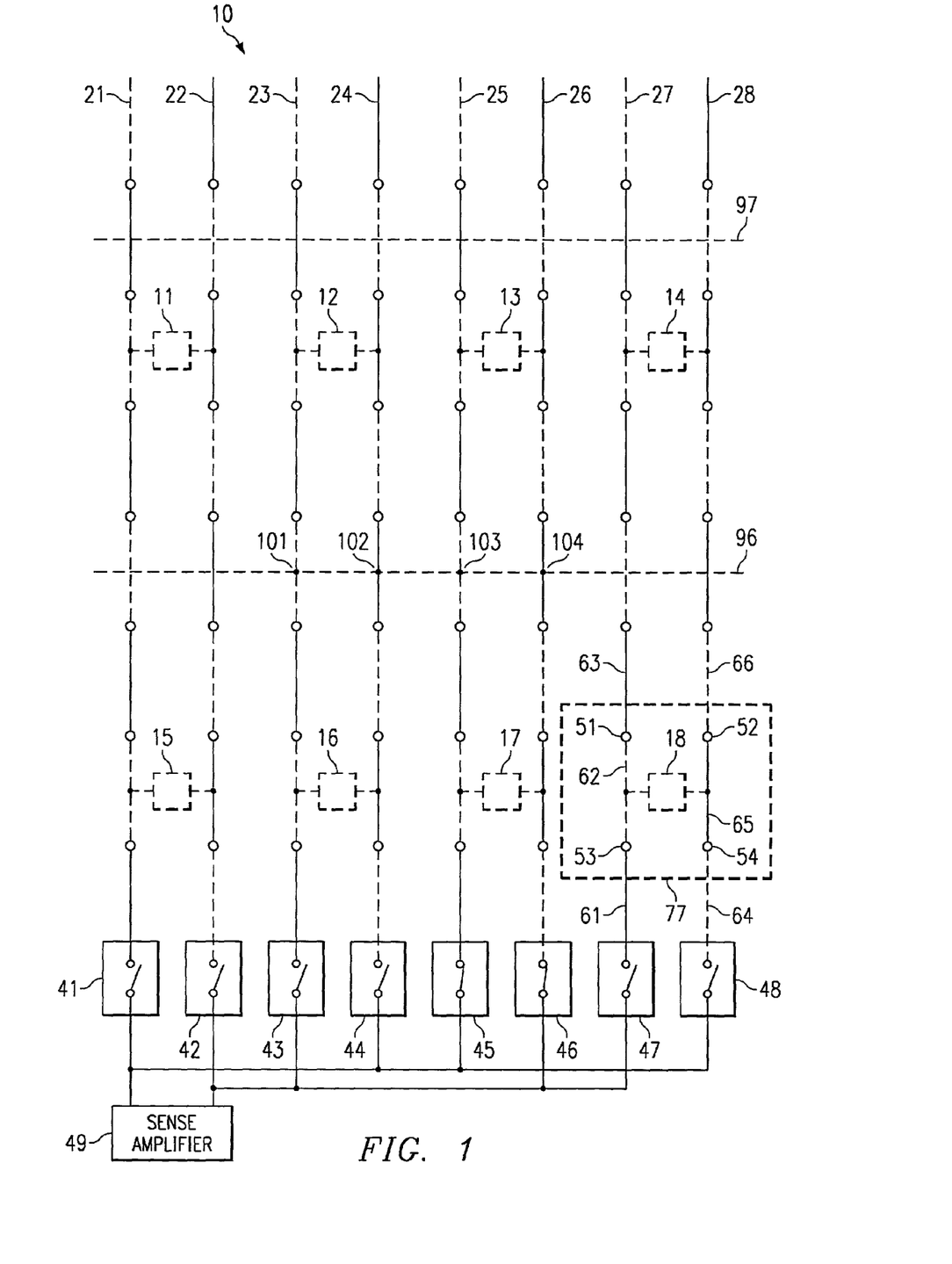
FIG. 1 is diagrammatic top view of pertinent portions of a memory circuit which embodies the present invention, and which is implemented in an integrated circuit device.

FIG. 1 is a diagrammatic top view of a circuit 10 which is part of a semiconductor memory implemented in an integrated circuit. The circuit 10 includes a plurality of memory cells arranged in a two-dimensional array with a plurality of rows and a plurality of columns, eight of the memory cells being shown diagrammatically at 11–18. For clarity, FIG. 1 does not show all of the memory cells in the array. The memory cells 11–14 are disposed in one row of the array, and the memory cells 15–18 are disposed in a different row of the array. The memory cells 11 and 15 are disposed in one column of the array, the memory cells 12 and 16 are disposed in another column, memory cells 13 and 17 are disposed in yet another column, and the memory cells 14 and 18 are disposed in still another column. Each of the memory cells has an internal circuit configuration which is of a type known to those skilled in the art, and the internal circuitry of the memory cells is therefore not illustrated and described here in detail.

The memory circuit 10 includes eight conductive runs 21–28 which are called bitlines. The bitlines 21–28 are arranged in pairs, where each pair serves a respective column of the memory cell array. In particular, bitlines 21–22 form a pair which serves one column, bitlines 23–24 form a pair which serves another column, bitlines 25–26 form another pair which serves a further column, and bitlines 27–28 form a pair which serves still another column. The memory cells in each column are each coupled to the two bitlines for that column, through vias which have been omitted in FIG. 1 for clarity.

Each of the bitlines 21–28 is coupled to a sense amplifier 49 through a respective electronic switch 41–48. The configuration and structure of the switches 41–48 and the sense amplifier 49 are known to those skilled in the art, and are therefore not illustrated and described in detail here. In order to use the sense amplifier 49 to access a selected memory cell, for example memory cell 17, the two switches associated with the column for that memory cell are closed, as shown at 45–46, and the switches serving the other columns are all open, as shown at 41–44 and 47–48. Within the selected column, the particular memory cell of interest may be selected using an addressing arrangement which is of a type known to those skilled in the art, and which has been omitted from FIG. 1 for clarity. This addressing arrangement includes for each row of the memory cell array a respective word line, which can be energized in order to select the memory cells in that row. A memory cell which has both its wordline and its bitlines active can be accessed for the purpose of reading information from or writing information to that cell.

Each of the bitlines 21–28 is subdivided into eight successive portions in FIG. 1, four of which are shown in solid lines, and four of which are shown in broken lines. The portions shown in solid lines are implemented in one metalization layer of the integrated circuit, and the portions shown in broken lines are implemented in a different metalization layer. In order to couple successive portions of each bitline to each other, a plurality of vias extend between the two metalization layers through the insulating layer, and four of these vias are identified by reference numerals 51–54 in FIG. 1.

For each of the bitlines 21–28, it will be noted that successive portions of the bitline along the length thereof are alternatingly disposed in the two different metalization layers. It will also be noted that, for each of the bitlines 21–28, any given portion thereof is in a metalization layer different from the metalization layer containing the adjacent portion of each adjacent bitline. For example, the bitline 27 includes three portions 61–63 and the bitline 28 includes three portions 64–66. The portions 61, 63 and 65 are in one metalization layer, and the portions 62, 64 and 66 are in the other metalization layer. The adjacent portions 63 and 66 are thus in different metalization layers, as are the adjacent portions 62 and 65, and the adjacent portions 61 and 64.

Figure 2:
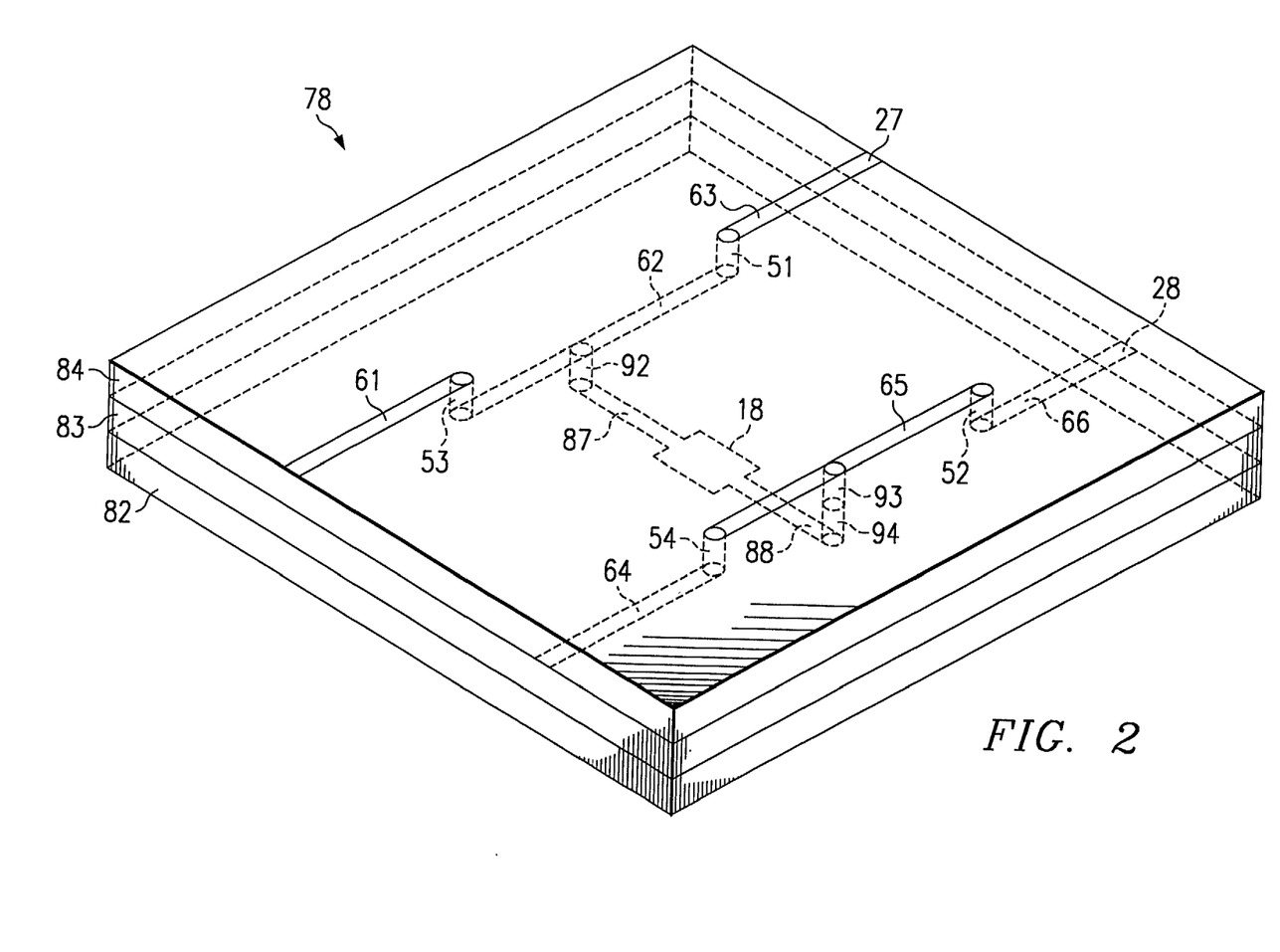
FIG. 2 is a diagrammatic perspective view of a portion of the circuitry of FIG. 1 as well as a portion of the integrated circuit device which contains it.

In order to show this even more clearly, a portion 77 of the circuit 10 is shown in FIG. 2, which is a diagrammatic perspective view of a section 78 of the integrated circuit that contains the memory circuit 10 of FIG. 1. As shown in FIG. 2, the integrated circuit includes a substrate 82 which has the memory cell 18 implemented therein. In the disclosed embodiment, the substrate 82 includes multiple layers which, for clarity, not shown in detail in FIG. 2. In particular, the substrate 82 includes a semiconductor substrate having the circuit 18 implemented therein, at least one layer of an insulating material such as silicon dioxide on the semiconductor substrate, and a metalization layer provided on the insulating layer. There may optionally be a further insulating layer on the metalization layer, and a further metalization layer on the further insulating layer. In the disclosed embodiment of FIG. 2, the upper metalization layer within the substrate 82 is disposed on the upper surface of the substrate 82.

The integrated circuit further includes two insulating layers 83 and 84 provided above the substrate 82. The metalization layer disposed within the substrate 82 at the top surface thereof includes two leads 87–88, which each help to couple the memory cell 18 to a respective one of the two associated bitlines 27–28. Between the insulating layers 83 and 84 is another metalization layer, which includes the portion 62 of the bitline 27 and the portions 64 and 66 of the bitline 28. On top of the insulating layer 84 is a further metalization layer which includes the portions 61 and 63 of the bitline 27, and the portion 65 of the bitline 28. The vias 51–54 each extend through the insulating layer 84 between the metalization layers located on opposite sides thereof. A further via 92 extends through the insulating layer 83 in order to couple the portion 62 of bitline 27 to the lead 87. In addition, two vias 93 and 94 are in electrical contact with each other and respectively extend through the insulating layers 84 and 83, in order to electrically couple the portion 65 of bitline 28 to the lead 88 for the circuit 18.

Due to the fact that the adjacent portions 62 and 65 of bitlines 27 and 28 are disposed in different metalization layers, which are on opposite sides of the insulating layer 84, the capacitive coupling between these adjacent portions of the bitlines is significantly less than what it would be if the bitline portions 62 and 65 were in the same metalization layer. The same is true of the adjacent bitline portions 61 and 64, and the adjacent bitline portions 63 and 66.

Referring again to FIG. 1, and as mentioned above, each of the bitlines 21–28 has eight portions of approximately equal length, four of which are disposed in one metalization layer, and the other four which are disposed in the other metalization layer. When the four portions of any bitline that are in one metalization layer are viewed cumulatively, and when the other four portions of that bitline in the other metalization layer are also viewed cumulatively, it will be recognized that each bitline has approximately half of its overall length and material disposed in one metalization layer, and the other half disposed in the other metalization layer. This helps ensure that both resistance and capacitance are balanced between the two bitlines of each pair.

Although the embodiment of FIG. 1 shows that each bitline has approximately half of its metal in one metalization layer and the other half of its metal in the other metalization layer, which represents a ratio of 1:1 between the metalization layers, it would alternatively be possible to use some other ratio. But where some other ratio was used, it would be desirable that the ratio be substantially the same for all of the bitlines, and especially for the two bitlines of each pair.

Referring again to FIG. 1, reference numeral 96 represents a plane which is perpendicular to the direction in which the bitlines 21–28 extend. It will be noted that, considering the point at which each bitline intersects the plane 96, each adjacent bitline intersects the plane 96 at a point which is in the opposite metalization layer. For example, bitline 24 intersects the plane 96 at a point 102 which is in one metalization layer, whereas the adjacent bitlines 23 and 25 each intersect the plane 96 at points 101 and 103 which are in the other metalization layer. similarly, the point 103 at which bitline 25 intersects the plane 96 is in a metalization layer different from the points 102 and 104 at which the adjacent bitlines 24 and 26 intersect the plane 96. It will be noted that this is also true in the case of a further plane 97. In fact, this is true for each of the bitlines 21–28 along substantially the full length thereof. In this regard, and as a practical matter, each bitline is, of course, disposed in both metalization layers at each feedthrough or via, but for purposes of the present invention this represents a negligible portion of the overall length of each bitline. Further, there may be situations where two bitlines have adjacent portions that are disposed in the same metalization layer for a short distance, for example to allow one or both bitlines to cross some third line, but the invention also contemplates that this distance will be relatively short in comparison to the overall length of the bitlines.

Figure 3:
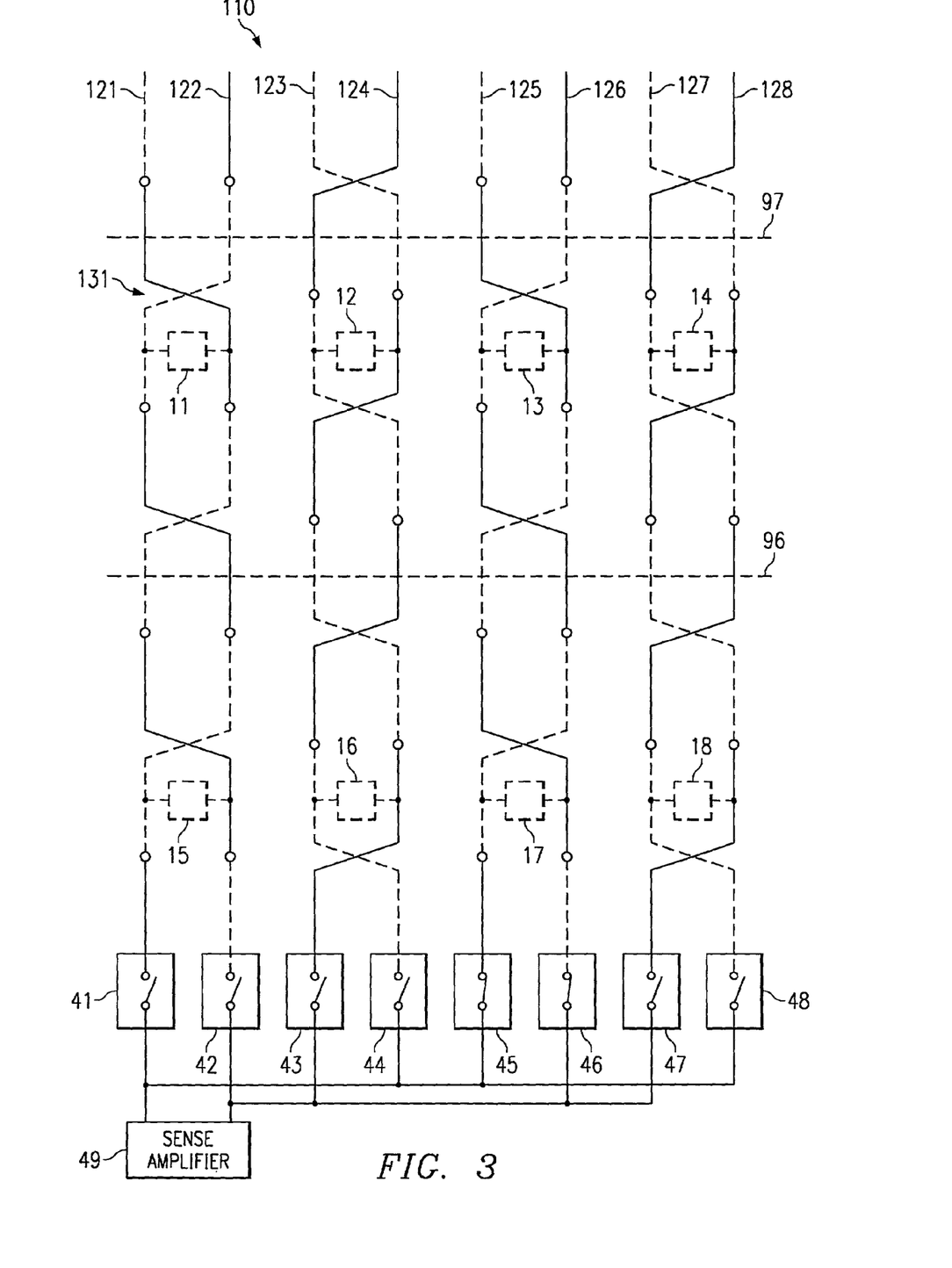
FIG. 3 is a diagrammatic top view similar to FIG. 1, but showing a memory circuit which is an alternative embodiment of the circuit of FIG. 1, and which also embodies the present invention.

FIG. 3 is a diagrammatic top view similar to FIG. 1, but showing a circuit 110 which is an alternative embodiment of the circuit 10 of FIG. 1. The circuit 110 of FIG. 3 is generally similar to the circuit 10, except for the differences described below. More specifically, the circuit 110 includes eight bitlines 121–128, which are arranged in four pairs. The first pair 121–122 serves one column, the second pair 123–124 serves another column, a third pair 125–126 serves still a further column, and a fourth pair 127–128 serves yet another column. Each of these pairs of bitlines has three or four twists or crossovers, one of which is identified by reference numeral 131. The crossovers helps to reduce effective capacitive coupling between bitlines in different columns. The crossovers serve to reduce the worst case coupling between bitlines that carry voltages which are changing in opposite directions.

For example, referring back to FIG. 1, the bitlines 22 and 23 serve respective different columns, but are adjacent to each other throughout their full length, from the top of FIG. 1 down to the switches 42 and 43. In contrast, in FIG. 3, the bitlines 122 and 123 also serve respective different columns, but it will be noted that they are adjacent each other for only about 25% of their lengths, rather than 100% of their lengths. This helps to significantly reduce capacitive coupling between the bitlines 122 and 123 of FIG. 3, as compared to capacitive coupling between the bitlines lines 22 and 23 in FIG. 1. This crossing pattern is particularly effective for pairs of differential signals, in that it reduces the worst case coupling of signals making opposite voltage transitions. Notwithstanding the fact that the crossing pattern itself is useful in reducing capacitive coupling, the further reduction in coupling achieved by also switching the bitlines between different metalization layers is also advantageous.

It will be noted from FIG. 3 that the crossovers 131 in each column are offset relative to the crossovers in each adjacent column, in particular so that each crossover is approximately halfway between the two nearest crossovers in each adjacent column. Also, along the length of the bitlines in each pair, the vias in each bitline are each aligned with one of the crossovers in each adjacent column.

Notwithstanding the crossovers provided in the pairs of bitlines in FIG. 3, it should be noted that the circuit 110 of FIG. 3 shares a feature with the circuit 10 of FIG. 1. In particular, the planes 96 and 97 are reproduced in FIG. 3, and it will be noted that, for each bitline, the point at which that bitline intersects either plane is in a metalization layer different from the metalization layer containing the points at which adjacent bitlines intersect the plane 96 or 97. This is true all along the length of each of the bitlines 121–128, except at the feedthrough locations defined by vias, but such locations represent a negligibly small portion of the overall length of each bitline. It will also be noted from FIG. 3 that each of the bitlines 121–128 has approximately half of its overall length implemented in one metalization layer and the other half implemented in the other metalization layer, representing a ratio of 1:1.

Figure 4:
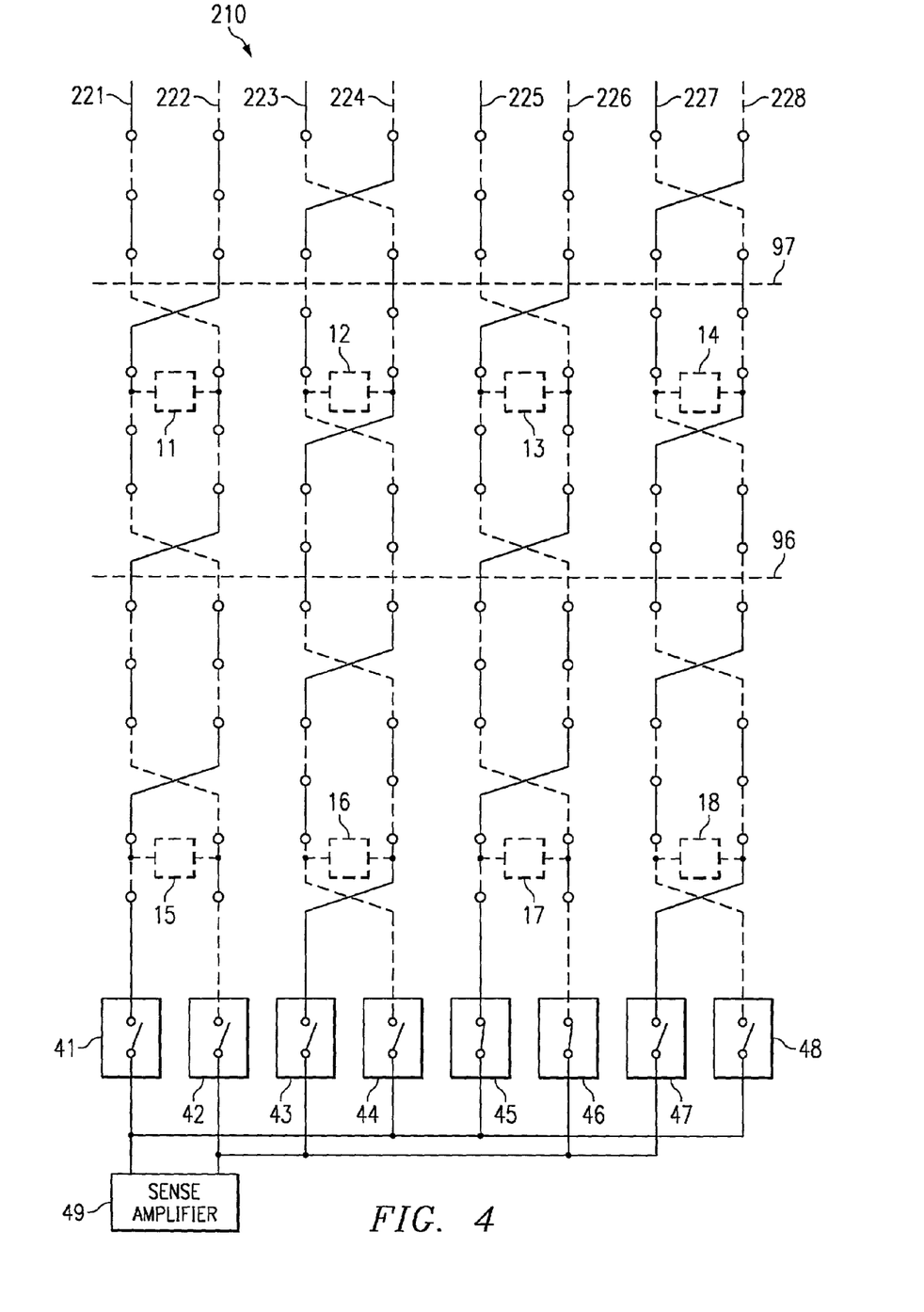
FIG. 4 is a diagrammatic top view similar to FIG. 3, but showing a memory circuit which is an alternative embodiment of the circuit of FIG. 3, and which embodies the present invention.

FIG. 4 is a diagrammatic top view similar to FIG. 3, but showing a circuit 210 which is still another alternative embodiment of the invention. The circuit 210 is generally similar to the circuit 110 of FIG. 3, except for one significant difference. In particular, the bitlines 221–228 of the circuit 210 each change between the two metalization layers almost twice as often as the bitlines 121–128 of FIG. 3. The bitlines 221–228 thus each have almost twice as many vias along the length thereof. This contributes to a reduced local imbalance between the bitlines. The planes 96 and 97 are each reproduced in FIG. 4, and it will be noted that, for each bitline, the point at which the bitline intersects either plane is in a metalization layer different from the points at which each adjacent bitline intersects that plane. This is true for each of the bitlines 221–228 along the full length thereof. It will also be noted from FIG. 4 that each of the bitlines 221–228 has approximately half of its overall length implemented in one metalization layer and the other half implemented in the other metalization layer, representing a ratio of 1:1.

Figure 5:
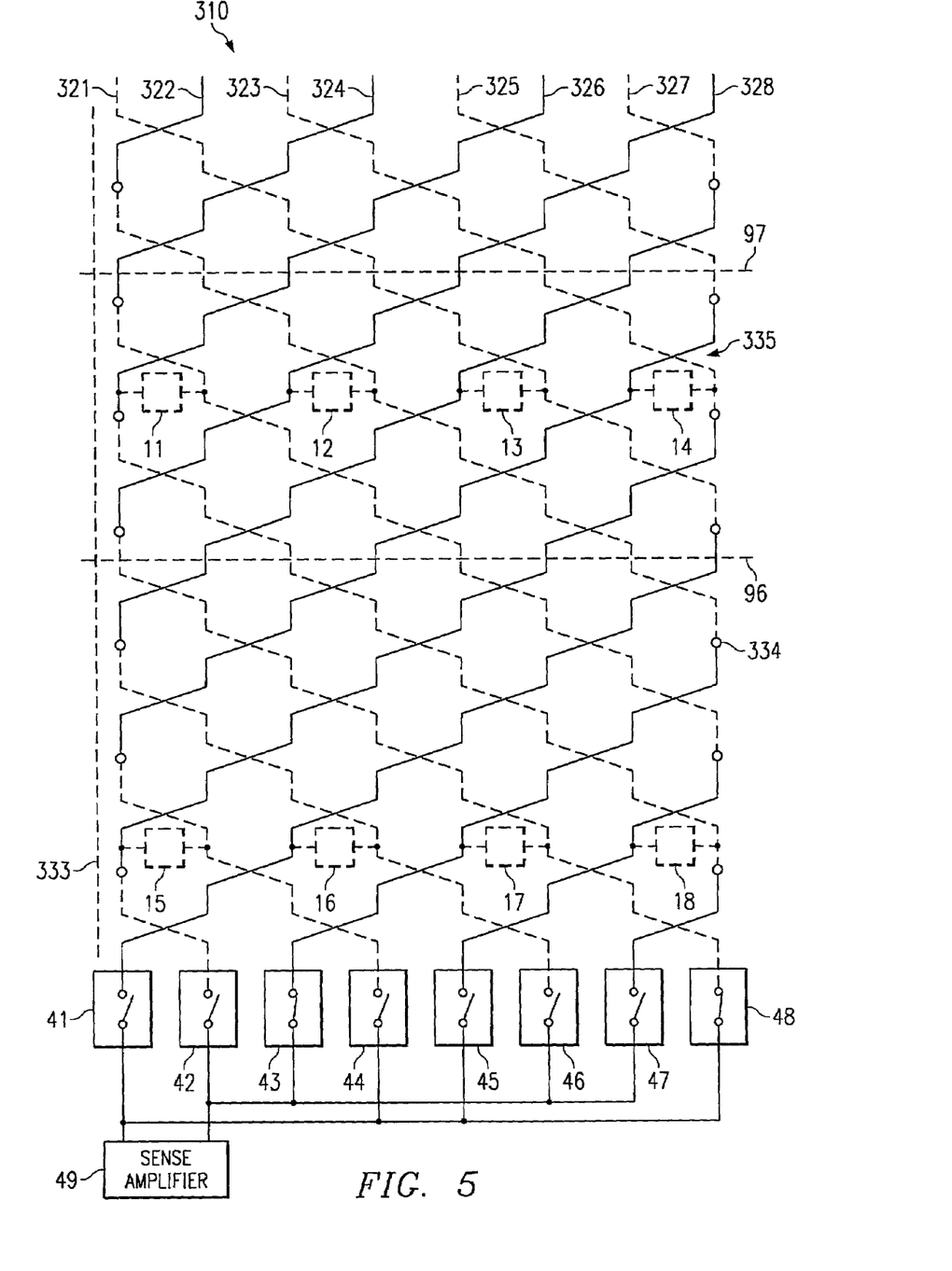
FIG. 5 is a diagrammatic top view similar to FIG. 1, but showing a memory circuit which is a further alternative embodiment of the circuit of FIG. 1 and which embodies the present invention.

FIG. 5 is a diagrammatic top view similar to FIG. 1, but showing a circuit 310 which is still another alternative embodiment of the invention. The circuit 310 includes eight bitlines 321–328. However, the bitlines 321–328 are not configured in pairs that each serve a respective column. Instead, although the bitlines 321–328 each extend from one end of the memory cell array to the other end thereof in a direction 333, each bitline also moves in a stairstep fashion across the array until it reaches an outer side of the array, and then changes direction and moves in a stairstep fashion back across the array. Each time a bitline reaches either side of the array, it changes metalization layers through a respective via, for example as indicated at 334. The stairsteps each include a crossover, which is similar to the crossovers described above in association with FIG. 3. One of the crossovers in FIG. 5 is designated by reference numeral 335.

In FIG. 5, each memory cell is coupled to two of the bitlines, and those two bitlines are used to access that particular cell. For example, the memory cell 17 is assessed using the bitlines 322 and 328. The stairstep routing of bitlines in FIG. 5 has some degree of effectiveness in reducing the extent to which any given bitline has portions adjacent to (and thus capacitively coupled to) any other bitline. Further, to the extent that short portions of any bitlines are adjacent, they are disposed in different metalization layers, as evidenced at each of the planes 96 and 97 in FIG. 5. In fact, this is true along substantially the entire of each of the bitlines 321–328, for any plane which is perpendicular to the basic direction 333 in which the bitlines extend from one end of the array to the other end thereof. It will also be noted from FIG. 5 that each of the bitlines 321–328 has approximately half of its overall length implemented in one metalization layer and the other half implemented in the other metalization layer, representing a ratio of 1:1.

Figure 6:
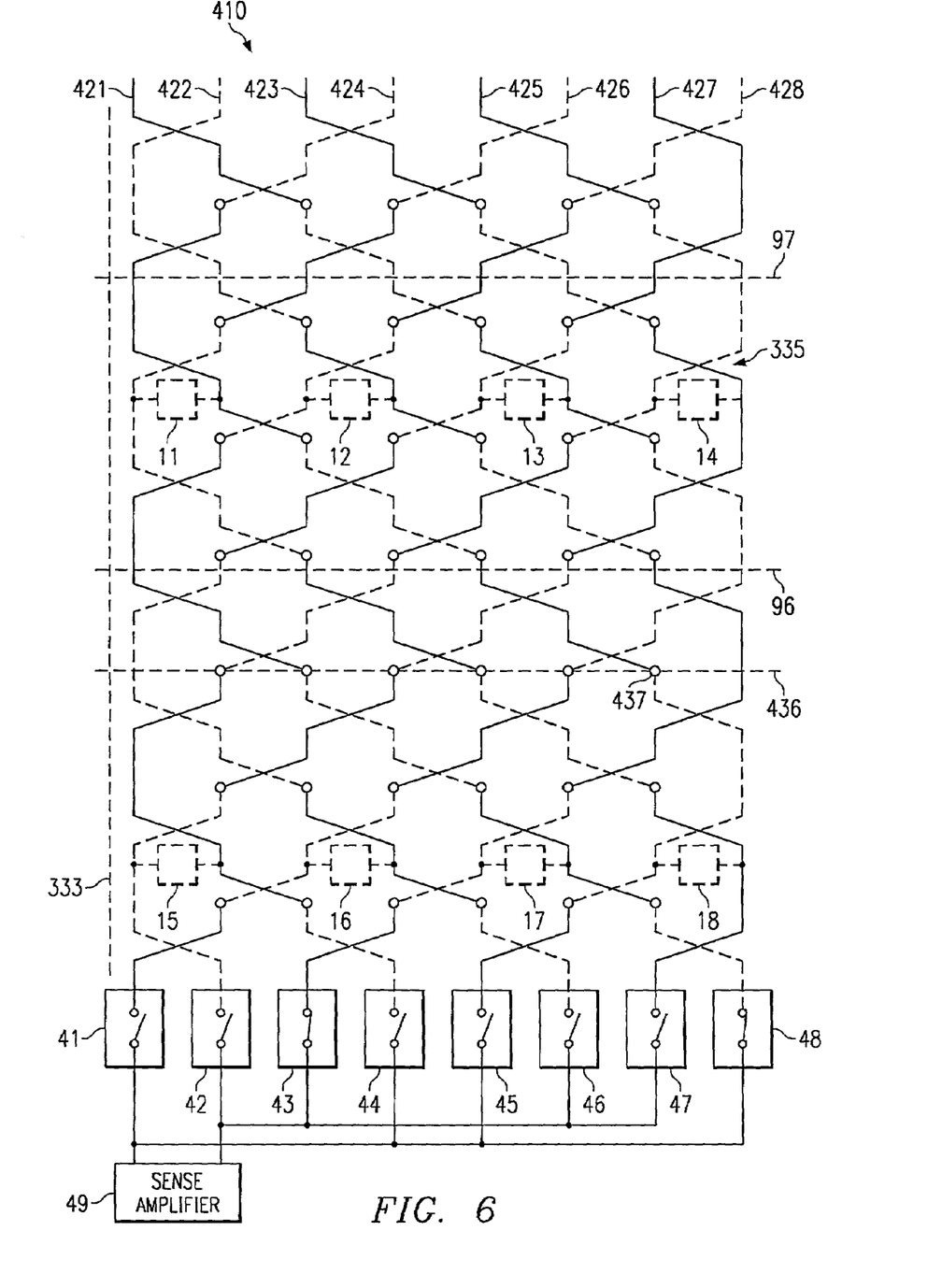
FIG. 6 is a diagrammatic top view similar to FIG. 5, but showing a memory circuit which is still another alternative embodiment of the circuit of FIG. 5, and which embodies the present invention.

FIG. 6 is a diagrammatic top view similar to FIG. 5, but depicts a circuit 410 which is an alternative embodiment of the circuit 310 of FIG. 5. The circuit 410 is almost identical to the circuit 310 of FIG. 5, including the fact that eight bitlines 421–426 in FIG. 6 have the same stairstep routing as the bitlines in FIG. 5. A significant difference is that, at each location along the direction 333 where the circuit 310 of FIG. 5 has two vias respectively located in the outermost bitlines, the circuit 410 of FIG. 6 has no vias in the outermost bitlines, but has a via in each of the bitlines between the outermost bitlines. For example, along the line 436 in FIG. 6, the outermost bitlines are 427 and 422, neither of which has a via. The six bitlines between them are bitlines 425, 428, 423, 426, 421 and 424, each of which has a via. For example, the via for bitline 424 is indicated by reference numeral 437. In contrast, in the corresponding portion of the circuit 310 of FIG. 5, only the two outermost bitlines each have a via, one of which is designated by reference numeral 334.

In FIG. 6, it will be noted that, for each of the bitlines 421–428, the point at which the bitline intersects the plane 96 is in a metalization layer different from the points at which adjacent bitlines intersect the plane 96. This is also true at the plane 97, and in fact is true along substantially the full length of each of the bitlines 421–428. It will also be noted from FIG. 6 that each of the bitlines 421–428 has approximately half of its overall length implemented in one metalization layer and the other half implemented in the other metalization layer, representing a ratio of 1:1.

As evident from the foregoing discussion, the various embodiments disclosed in FIGS. 1–6 are each a semiconductor memory circuit. However, it will be recognized that the present invention is not limited to memory circuits, and could be utilized in a variety of other types of circuits, including any type of circuit which processes differential signals, where it is advantageous to have balanced lines with reduced capacitive coupling.

The present invention provides a number of technical advantages. One such technical advantage is that, where two or more lines extend in generally the same direction, capacitive coupling between the lines can be reduced by placing successive portions of each line in different metalization layers, in a manner so that adjacent portions of adjacent lines are also disposed in different metalization layers. A further advantage is that characteristics such as resistance and capacitance of each line can be balanced by providing for each line substantially the same ratio between the amount of metal in one metalization layer and the amount of metal in the other metalization layer. It can be further advantageous if the ratio is approximately one-to-one.

Still another advantage of the invention results when the arrangement of each line in different metalization layers is coupled with the use of routing techniques such as crossovers or stairstep routing, in order to further reduce capacitive coupling between the lines. Another advantage of the invention is that, by changing more frequently between the two metalization layers along the length of a given line, the potential for local imbalance is reduced. In a circuit where two lines can be used to carry a differential voltage, use of the invention to reduce non-symmetric coupling can help to improve the accuracy of differential voltages which may be carried by those two lines. Another advantage of the invention results when techniques according to the invention are used in the specific context of a semiconductor memory array, for example for the bitlines thereof. In this regard, even though the disclosed embodiment happens to be a static random access memory (SRAM), the invention is also applicable to a dynamic random access memory (DRAM).

Although several selected embodiments have been illustrated and described in detail, it will be recognized that various substitutions and alterations can be made therein without departing from the spirit and scope of the present invention, as defined by the following claims.

What is claimed is:

1. An apparatus comprising an integrated circuit which includes:

an insulating layer; and a group of at least two elongate runs which are electrically conductive, which are electrically separate from each other, which each extend approximately in a direction, and which each have along the length thereof alternating first and second portions that are electrically coupled by third portions, said first portions of said runs being located on a side of said insulating layer opposite from said second portions thereof, and said third portions having sections which extend through said insulating layer;

wherein for substantially each point along each of said first and second portions of each of said runs, a plane perpendicular to said direction and containing that point intersects a respective different point of every other said run, each pair of adjacent said points in said plane being points which are respectively located on opposite sides of said insulating layer, and further wherein at least one of said first portions of each said runs crosses over one of said second portions of another of said runs.

2. An apparatus according to claim 1, wherein for each said run, a cumulative amount of material in said first portions thereof conforms to a predetermined ratio in relation to a cumulative amount of material in said second portions thereof.

3. An apparatus according to claim 2, wherein said predetermined ratio is substantially 1:1.

4. An apparatus according to claim 1, wherein said runs each extend substantially parallel to said direction and substantially parallel to each other along the entire length thereof.

5. An apparatus according to claim 1, wherein said runs of said group includes first, second, third and fourth runs, said first and second runs each having at least one of said first portions thereof arranged to cross over one of said second portions of the other thereof, said third and fourth runs each having at least one of said first portions thereof arranged to cross over one of said second portions of the other thereof, and said first and second runs each having a respective said third portion thereof aligned with each said crossover of said third and fourth runs.

6. An apparatus according to claim 5, wherein said third and fourth runs each have a respective said third portion thereof aligned with each said crossover of said first and second runs.

7. An apparatus according to claim 1, wherein each said run is routed in a stairstep manner across other said runs until an outer side of said group is reached, and then is routed in a stairstep manner back across other said runs toward an opposite side of said group.

8. An apparatus according to claim 7, wherein said third portions of each said run are located where that run is at one of the outer sides of said group.

9. An apparatus according to claim 1, wherein each said run is routed in a stairstep maimer across other said runs until an outer side of said group is reached, and then is routed in a stairstep manner back across other said runs toward an opposite side of said group, each said run being free of said third portions thereof at locations where that run reaches either outer side of said group, said third portions of each said run being located adjacent one of said crossovers of that run in approximate alignment with one of said locations where another said run reaches either outer side of said group.

10. An apparatus according to claim 1, wherein said integrated circuit includes an array of memory cells, each of said cells being electrically coupled to one of said runs.

11. An apparatus according to claim 1, wherein said integrated circuit includes an array of memory cells, each of said cells being electrically coupled to two of said runs.

12. An apparatus according to claim 11, wherein said integrated circuit includes a sense amplifier, and includes a plurality of selectively actuatable electronic switches which each couple said sense amplifier to a respective one said runs of said group.

13. An apparatus according to claim 1, wherein a segment of one of said two elongate runs is disposed on the same side of said insulating layer as a segment of the other of said two elongate runs, each said segment being part of a respective said third portion of a respective one of said two elongate runs, and including on a side of said insulating layer opposite from said segments a further run which is separate from said runs of said group.

14. A method of making an integrated circuit having an insulating layer and a group of at least two elongate runs which are electrically conductive, which are electrically separate from each other, and which each extend approximately in a direction, comprising the steps of:
configuring each of said runs to have along the length thereof alternating first and second portions that are electrically coupled by third portions;
locating said first portions of each of said runs on a side of said insulating layer opposite from said second portions thereof in a manner so that, for substantially each point along each of said first and second portions of each of said runs, a plane perpendicular to said direction and containing that point intersects a respective different point of every other said run, each pair of adjacent said points in said plane being points which are respectively located on opposite sides of said insulating layer, and further wherein at least one of said first portions of each said runs crosses over one of said second portions of another of said runs; and fabricating conductive sections which each extend through said insulating layer, each of said third portions including one of said sections.

15. A method according to claim 14, wherein said configuring step includes the step of configuring said first and second portions so that, for each said run, a cumulative amount of material in said first portions thereof conforms to a predetermined ratio in relation to a cumulative amount of material in said second portions thereof.

16. A method according to claim 15, including the step of selecting a ratio of 1:1 as said predetermined ratio.

17. A method according to claim 14, including the step of routing said runs so that said runs each extend substantially parallel to said direction and substantially parallel to said each other along the entire length thereof.

18. A method according to claim 14, wherein said routing step includes the step of routing first and second runs of said group so that they each have at least one of said first portions thereof arranged to cross over one of said second portions of the other thereof, and includes the step of routing said third and fourth runs so that they each have at least one of said first portions thereof arranged to cross over one of said second portions of the other thereof and wherein said fabricating step is carried out by locating a respective said third portion of each of said first and second runs in alignment with a respective said crossover of said third and fourth runs, and locating a respective said third portion of each of said third and fourth runs in alignment with a respective said crossover of said first and second runs.

19. A method according to claim 14, wherein said routing step includes the step of routing each of said runs in a stairstep manner across other said runs until an outer side of said group is reached, and then routing that run in a stairstep manner back across other said runs toward an opposite side of said group, and wherein said fabricating step is carried out by locating said third portions of each said run where that run is at one of the outer sides of said group.

20. A method according to claim 14, wherein said routing step includes the step of routing each said run in a stairstep manner across other said runs until an outer side of said group is reached, and then routing that run in a stairstep manner back across other said runs toward an opposite side of said group, and wherein said fabricating step includes the step of keeping each said run free of said third portions at locations where that runs reaches either outer side of said group, and locating a respective said third portion of each said run adjacent one of said crossovers of that run and in approximate alignment with one of the locations where another said run reaches either outer side of said group.

21. A method according to claim 14, wherein said integrated circuit includes an array of memory cells, and including the step of electrically coupling each said memory cell to two of said runs.

22. A method according to claim 21, including the step of coupling each of said runs to a sense amplifier of said integrated circuit through a respective electronic switch of said integrated circuit.

* * * * *